United States Patent [19]
Saito

[11] Patent Number: 5,994,643
[45] Date of Patent: Nov. 30, 1999

[54] HOUSING

[75] Inventor: Yoshio Saito, Fukushima-ken, Japan

[73] Assignee: Alps Electric Co., Ltd., Tokyo, Japan

[21] Appl. No.: 09/008,026

[22] Filed: Jan. 16, 1998

[30] Foreign Application Priority Data

Jan. 22, 1997 [JP] Japan ..................... 9-023172

[51] Int. Cl.⁶ .................................................. H05K 9/00
[52] U.S. Cl. ........................... 174/35 R; 174/66; 220/3.8
[58] Field of Search ................... 174/66, 35 R; 220/3.8, 241

[56] References Cited

U.S. PATENT DOCUMENTS

| | | | |
|---|---|---|---|
| 3,952,908 | 4/1976 | Carson | 220/3.8 X |
| 4,065,020 | 12/1977 | Carson | 220/3.8 X |
| 4,322,702 | 3/1982 | Bosch | 220/3.8 X |
| 4,567,318 | 1/1986 | Shu | 174/35 GC |
| 4,863,059 | 9/1989 | Christensen | 220/3.8 X |
| 5,001,298 | 3/1991 | Jong | 174/35 R |
| 5,182,696 | 1/1993 | Her | 174/35 R X |
| 5,383,098 | 1/1995 | Ma et al. | 174/35 R X |
| 5,436,802 | 7/1995 | Trahan et al. | 174/35 R X |
| 5,886,879 | 3/1999 | Matuschik | 174/35 R X |

FOREIGN PATENT DOCUMENTS 2508239  5/1996  Japan .

Primary Examiner—Dean A. Reichard
Attorney, Agent, or Firm—Brinks Hofer Gilson & Lione

[57] ABSTRACT

A housing includes a frame having side walls and a bottom portion and further having an engaging portion along an opening brim of the frame and a cover engaged with the engaging portion to close the opening of the frame, the engaging portion having a vertical plane formed as an inner surface of each side wall of the frame and also having a stepped portion which faces the opening brim side of the frame, the stepped portion including a horizontal plane which is approximately perpendicular to the vertical plane and an inclined plane which is contiguous to the horizontal plane and which is inclined toward the bottom portion side as it approaches the vertical plane, the cover having a flat marginal portion and a plurality of first engaging pawls projecting from the marginal portion and inclined at a predetermined angle relative to the marginal portion, the marginal portion of the cover being brought into surface contact with the horizontal plane of the engaging portion, the first engaging pawls being brought into surface contact with the inclined plane of the engaging portion, and the tips of the first engaging pawls being allowed to bite into the vertical plane of the engaging portion and thereby engaged with the vertical plane.

3 Claims, 5 Drawing Sheets

HOUSING

BACKGROUND OF THE INVENTION

The present invention relates to a housing suitable for a high-frequency electronic device such as, for example, a down converter for receiving satellite broadcasting.

A conventional housing for a high-frequency electronic device will be described below with reference to FIGS. 8 to 11. FIG. 8 is a perspective view of a frame used in the conventional housing, FIG. 9 is a perspective view of a cover for covering an opening of the frame shown in FIG. 8, FIG. 10 is a sectional view of principal portions, explaining how to engage the frame and the cover with each other, and FIG. 11 is a sectional view of principal portions, explaining a problem involved in the conventional frame-cover engagement.

In FIG. 8, the frame 31 comprises a receptacle portion 32 for receiving therein a circuit board (not shown) with electronic circuits formed thereon and a feed horn 33 for introducing a signal from a broadcasting satellite into the interior of the frame, the receptacle portion 32 and the feed horn 33 being formed as an integral body by die casting of aluminum. Terminals 34 as outlets of output signals after frequency conversion are attached to a side face of the receptacle portion 32. Inside an opening brim of the receptacle portion 32 is formed an engaging portion 38 to which a cover 37 shown in FIG. 9 is to be applied, the engaging portion 38 comprising a vertical plane 35 and a horizontal plane 36. The cover 37 is brought into engagement with the frame 31 to constitute a housing for a high-frequency electronic device.

The cover 37 shown in FIG. 9 is formed by subjecting a stainless steel plate to press working. The cover 37 comprises an expanded portion 39 having a flat central part and an inclined portion 39a formed along the marginal portion of the expanded portion 39. In the inclined portion 39a, first engaging pawls 40 and second engaging pawls 41 for engagement with the engaging portion 38 of the frame 31 are formed in an alternate manner. The first engaging pawls 40 extend longer than the second engaging pawls 41 directly from the inclined portion 39a.

The second engaging pawls 41 extend from the inclined portion 39a in parallel with the surface of the expanded portion 39. When the first and second engaging pawls 40 and 41 are engaged with the engaging portion 38 of the frame 31, the second engaging pawls 41 are in surface contact with the horizontal plane 36 of the engaging portion 38, while the first engaging pawls 40 are in surface contact with the horizontal plane 36 and their tips bite into the vertical plane 35 and are thereby engaged with the same plane.

A method for engaging the frame 31 with the cover 37 will now be described with reference to FIG. 10. First, the cover 37 is put on the horizontal plane 36 of the engaging portion 38 of the frame 31. In this state, the first engaging pawls 40 are inclined relative to the horizontal plane 36 and their tips are in abutment onto the horizontal plane 36. On the other hand, the second engaging pawls 41 are parallel to the horizontal plane 36 at a position higher than the horizontal plane 36. Next, a press 43 having pressing portions 42 correspondingly to the marginal portion of the cover 37 is brought down from above the cover 37, allowing the pressing portions 42 to press the first and second engaging pawls 40 and 41 of the cover 37. As a result, the first engaging pawls 40 are bent and extended at their base positions in parallel with the surface of the expanded portion 39 and their tips slide on the horizontal plane 36 toward the vertical plane 35 until they finally bite into the vertical plane 35 and are thereby engaged with the same plane.

In the above conventional housing, however, when the cover 37 is placed on the horizontal plane 36 of the engaging portion 38 of the frame 31, the first engaging pawls 40 are inclined relative to the horizontal plane 36 and their tips are in abutment with the horizontal plane obliquely, with the angle Ka (see FIG. 10) between the horizontal plane 36 and the first engaging pawls 40 Fez being large. Consequently, when the first and second engaging pawls 37 and 40 of the cover 37 are pressed by the pressing portions 42 of the press 43 to bend and extend the first engaging pawls 40, as shown in FIG. 11, the tips of the first engaging pawls 40 are difficult to slide on the horizontal plane 36 and bite into the horizontal plane, not into the vertical plane 35, resulting in that the engagement between the frame 31 and the cover 37 becomes incomplete.

SUMMARY OF THE INVENTION

Accordingly, it is an object of the present invention to solve the above-mentioned problem involved in the conventional housing and realize a complete engagement between the frame and the cover.

According to the present invention, in order to solve the above-mentioned problem, there is provided a housing which comprises a frame, the frame having side walls and a bottom portion and further having an engaging portion along an opening brim of the frame, and a cover engaged with the engaging portion to close the opening of the frame, the engaging portion having a vertical plane formed as an inner surface of each side wall of the frame and also having a stepped portion which faces the opening brim side of the frame, the stepped portion including a horizontal plane which is approximately perpendicular to the vertical plane and an inclined plane which is contiguous to the horizontal plane and which is inclined toward the bottom portion side as it approaches the vertical plane, the cover having a flat marginal portion and a plurality of first engaging pawls projecting from the marginal portion and inclined at a predetermined angle relative to the marginal portion, the marginal portion of the cover being brought into surface contact with the horizontal plane of the engaging portion, the first engaging pawls being brought into surface contact with the inclined plane of the engaging portion, and the tips of the first engaging pawls being allowed to bite into the vertical plane of the engaging portion and thereby engaged with the vertical plane.

Preferably, the cover in the housing of the present invention is further provided with second engaging pawls each formed between adjacent first engaging pawls and projecting from the marginal portion of the cover, the second engaging pawls being extended above the inclined plane of the engaging portion.

Preferably, the first engaging pawls are smaller in width from their base ends toward their tips.

DETAILED DESCRIPTION OF THE PREFERRED EMBODIMENTS

A housing according to the embodiments of the present invention will be described in detail hereinunder with reference to FIGS. 1 to 7.

Figure 1:
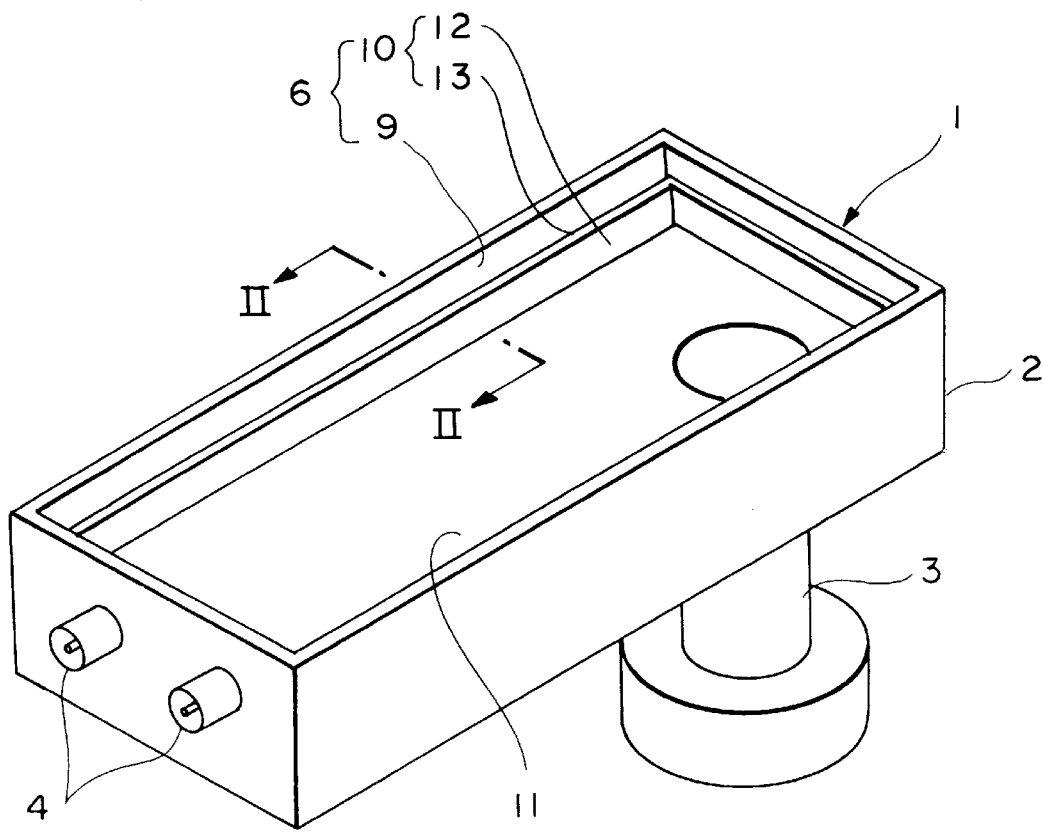
FIG. 1 is a perspective view of a frame used in a housing according to the present invention.
Figure 2:
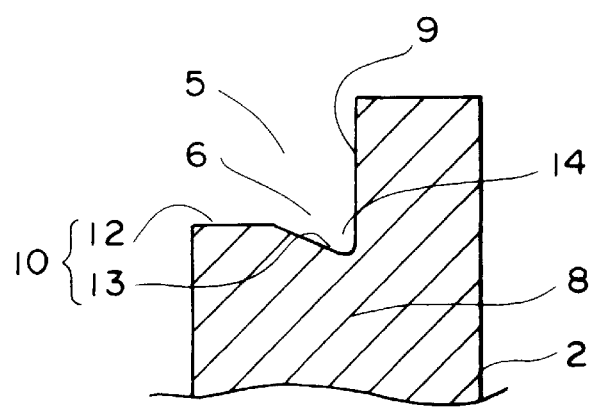
FIG. 2 is an enlarged sectional view of a principal portion of the frame taken on line II—II in FIG. 1.
Figure 3:
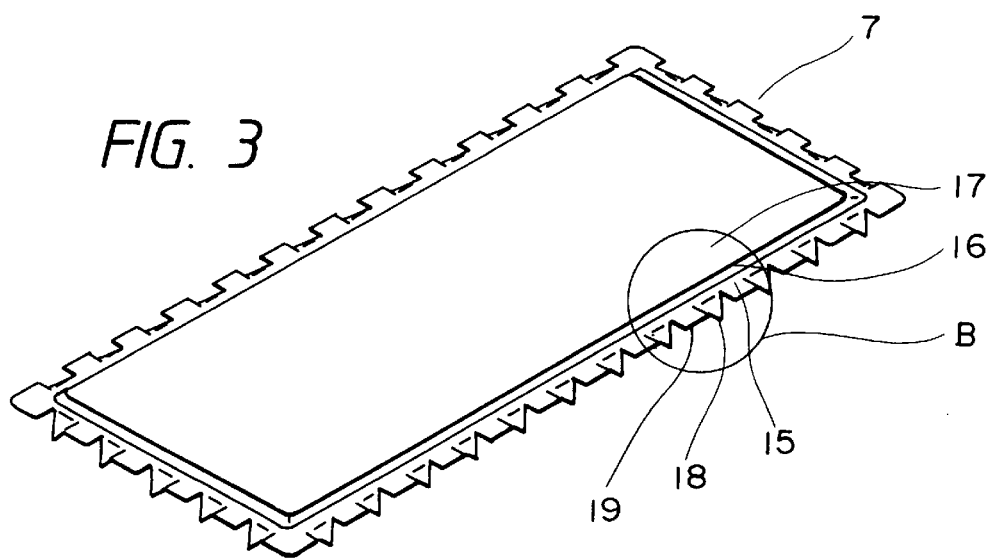
FIG. 3 is a perspective view of a cover used in the housing.

First, in FIGS. 1 and 2, a frame 1 comprises a receptacle portion 2 for receiving therein a circuit board (not shown) with electronic circuits formed thereon and a feed horn 3 for introducing a signal from a broadcasting satellite into the interior of the frame, the receptacle portion 2 and the feed horn 3 being formed as an integral body by die casting of aluminum. Terminals 4 as outlets of output signals after frequency conversion are attached projectingly to a side face of the receptacle portion 2. The receptacle portion 2 has a bottom on one side thereof and is open on the other side. An engaging portion 6 for the mounting of a cover is formed along an opening brim 5 of the receptacle portion 2. Further, a cover 7 shown in FIG. 3 is mounted to the frame 1 to constitute a housing.

As shown in FIGS. 1 and 2, the engaging portion 6 comprises a vertical plane 9 formed as an inner surface of each side wall 8 of the receptacle portion 2 along the opening brim 5 and a stepped portion 10 which faces the opening brim 5 side. The stepped portion has a horizontal plane 12 approximately parallel to the surface of a bottom 11 of the receptacle portion 2 and approximately perpendicular to the vertical plane 9 and also has an inclined plane 13 contiguous to the horizontal plane 12 and inclined to the bottom 11 side gradually toward the vertical plane 9. A groove 14 is formed by both the inclined plane 13 and the vertical plane 9.

Figure 4:
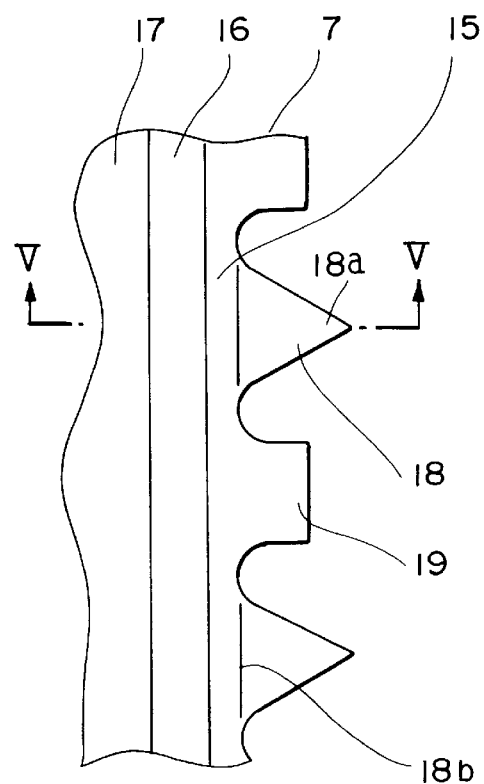
FIG. 4 is an enlarged plan view of portion B of the cover shown in FIG. 3.
Figure 5:
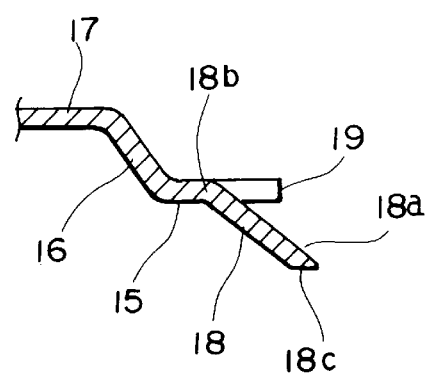
FIG. 5 is a sectional view taken on line V—V in FIG. 4.

On the other hand, the cover 7 to be engaged with the engaging portion 6 of the frame 1 is formed by subjecting a stainless steel plate to press working. As shown in FIGS. 3 to 5, the cover 7 has a flat marginal portion 15 and an expanded portion 17 centrally expanded outward from the marginal portion 15 through the inclined portion 16 to form a flat surface. The surface of the marginal portion 15 and the surface of the expanded portion 17 are parallel to each other. A plurality of first engaging pawls 18 and a plurality of second engaging pawls 19 both for engagement with the engaging portion 6 of the frame 1 are projected outward in an alternate manner from the marginal portion 15. As shown in FIG. 4, the first engaging pawls 18 are longer than the second engaging pawls 19 and are gradually become smaller in width toward the output to provide sharp tips 18a. Further, as shown in FIG. 5, the first engaging pawls 18 are bent at a bent portion 18b from the marginal portion 15 and are approximately parallel to the inclined portion 16. The tips 18a are thinner with a corner cut 18c formed on the underside thereof.

On the other hand, the second engaging pawls 19 extend from the marginal portion 15 in parallel with the surface of the marginal portion 15. In an engaged state of the first and second engaging pawls 18 and 19 with the engaging portion 6 of the frame 1, the marginal portion 15 is in surface contact with the horizontal plane 12. Further, the length of each second engaging pawl 19 is set so as to extend up to above the inclined surface 13 of the engaging portion 6, while the first engaging pawls 18 come into surface contact with the inclined surface 13 and their tips 18a bite into the vertical plane 9.

Figure 6:
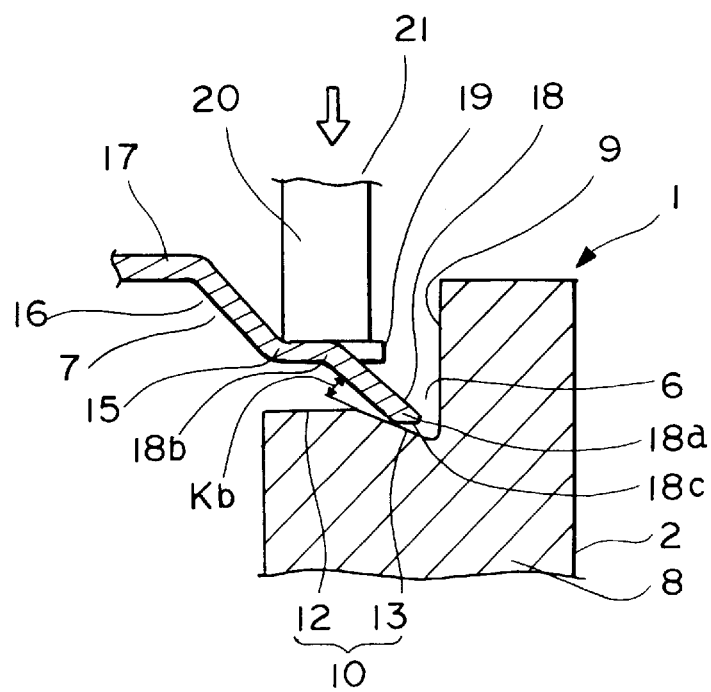
FIG. 6 is a sectional view of principal portions, explaining a method for engaging the cover with the frame.

Next, how to engage the cover 7 with the frame 1 will be described with reference to FIG. 6. First, the cover 7 is put on the stepped portion 10 in the engaging portion 6 of the frame 1. In this state, the tips 18a of the first engaging pawls 18 are abutted against the inclined surface 13 at a small angle Kb, while the second engaging pawls 19 are spaced from and parallel to the horizontal plane 12. Next, a press 21 having pressing portions 20 correspondingly to the marginal portion of the cover 7 is brought down from above to press the marginal portion 15 of the cover 7, the second engaging pawls 19 and the bent portion 18b at the pressing portions 20.

In this case, since the inclined surface 13 formed in the stepped portion 10 of the engaging portion 6 is inclined, the angle Kb between the first engaging pawls 18 and the inclined surface 13 becomes small, so that the tips 18a of the first engaging pawls 18 can slide easily on the inclined surface 13. Further, the tips 18a of the first engaging pawls 18 are thinner because the corner cut 18c is formed, and therefore the tips 18a slide more easily and do not bite into the inclined surface 13.

Figure 7:
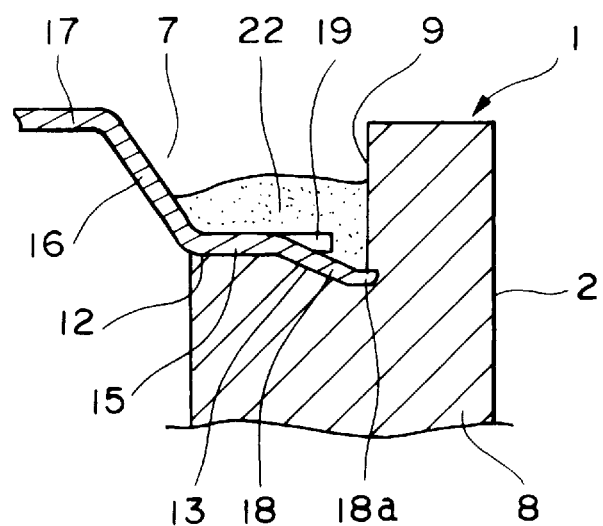
FIG. 7 is a sectional view of principal portions in a mounted state of the frame and the cover.
Figure 8:
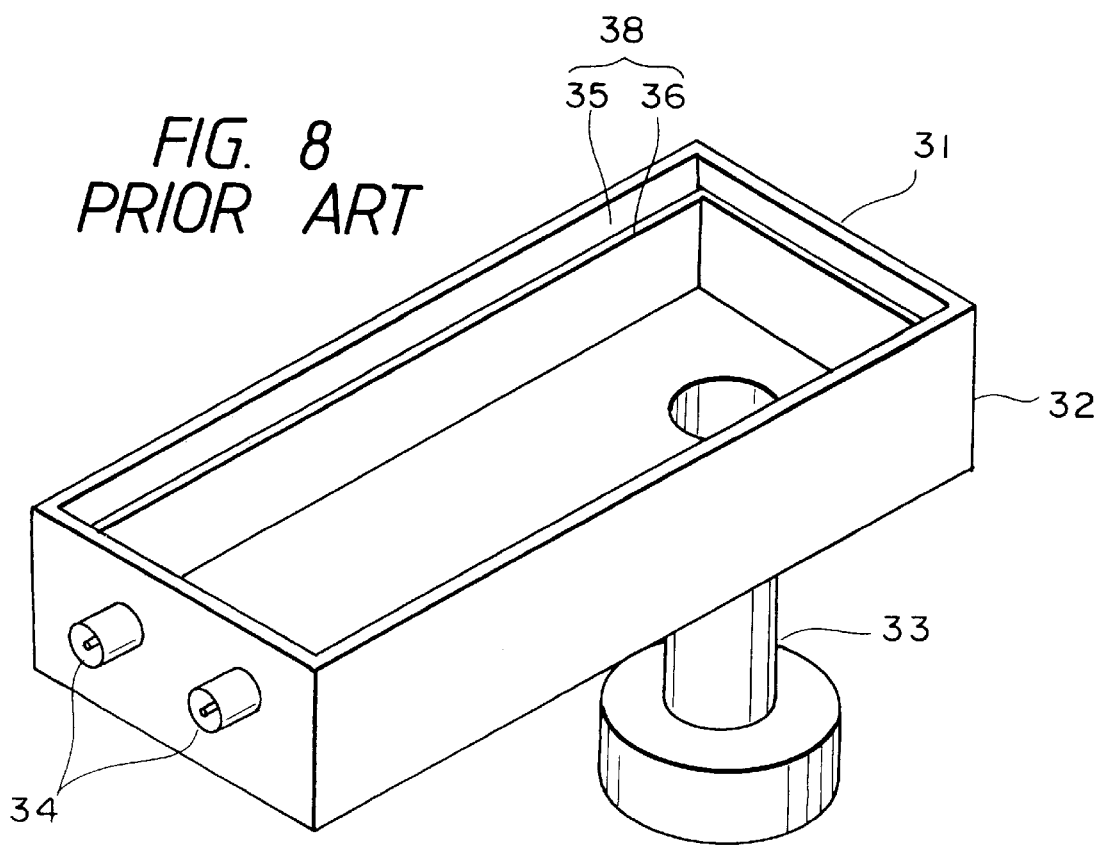
FIG. 8 is a perspective view of a frame used in a conventional housing.
Figure 9:
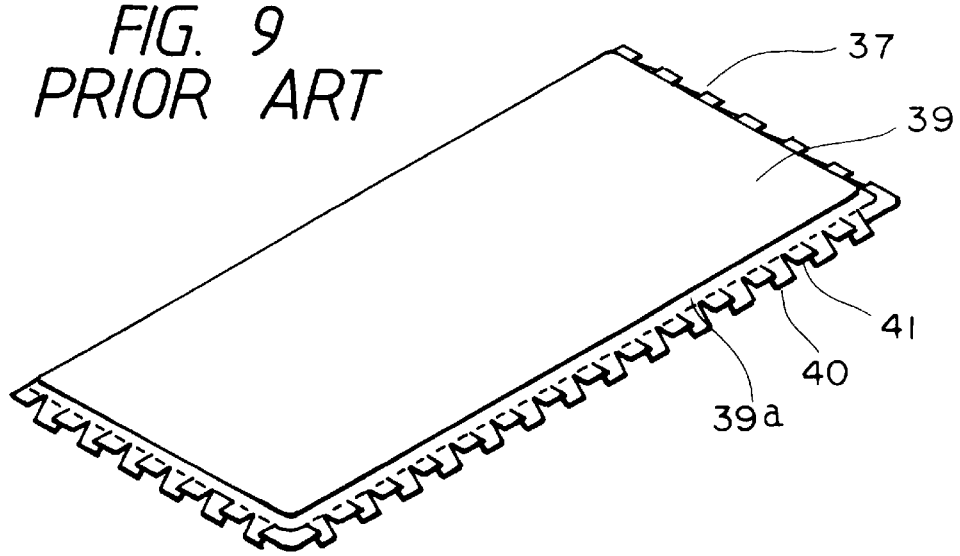
FIG. 9 is a perspective view of a cover used in the conventional housing.
Figure 10:
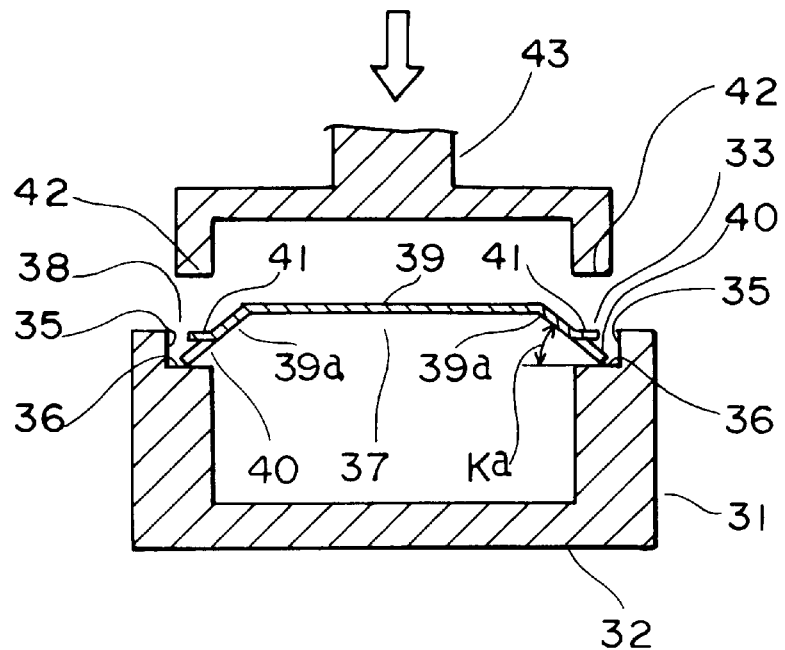
FIG. 10 is a sectional view of principal portions, explaining a method for engaging the cover with the frame in the conventional housing.
Figure 11:
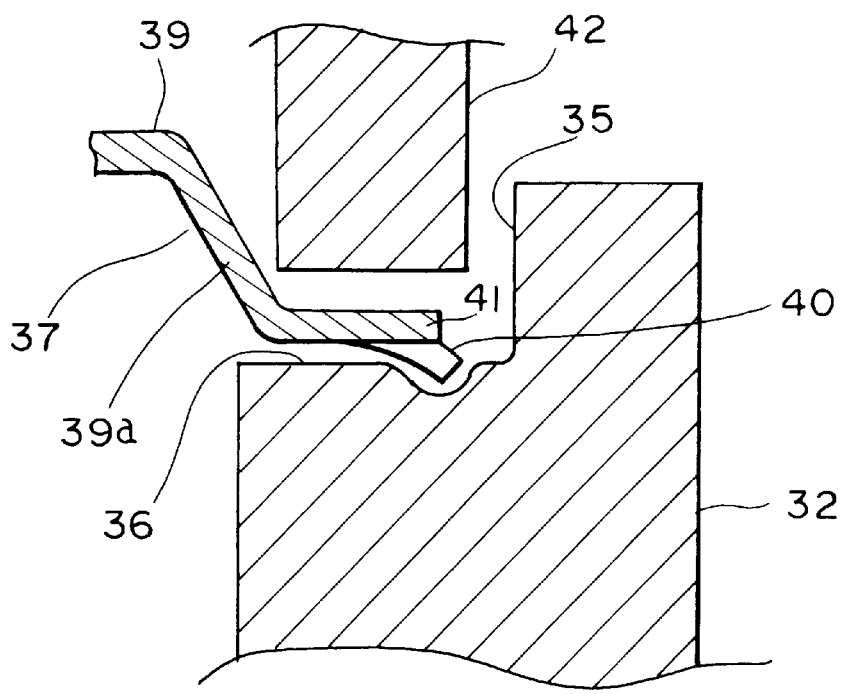
FIG. 11 is a sectional view of principal portions, explaining a problem involved in an engaged state of the frame and the cover in the conventional housing.

With the pressing force of the press 21, the bent portions 18b between the marginal portion 15 and the first engaging pawls 18 are deformed in such a manner that the bending angle opens, and the first engaging pawls 18 are bent at the bent portions 18b, so that the tips 18a slide on the inclined surface 13 and approach the vertical plane 9. When the marginal portion 15 has been pressed by the pressing portions 20 of the press 21 up to surface contact with the horizontal plane 12, the first engaging pawls 18 come into surface contact with the inclined surface 13 and the tips 18a bite into the vertical plane 9, as shown in FIG. 7. Further, the second engaging pawls 19 extend above the inclined surface 13, forming a clearance between the second engaging pawls 19 and the inclined surface 13. In this case, the tips 18a of the first engaging because they are sharp.

Further, the bent portions 18b are formed between the marginal portion 15 and the first engaging pawls 18. Therefor, when the marginal portion 15 is pressed with the press 21 in an abutted state of the tips 18a of the firs engaging pawls 18 against the inclined surface 13, the fist engaging pawls 18 are bent and extended at the bent portions 18b and their tips 18a approach the vertical plane 9.

After the engagement of the cover 7 with the frame 1 has been completed as above, a sealing agent such as, for example, silicone grease is filled into the engaging portion 6 to seal the receptacle portion 2 of the frame 1 from the exterior. The sealing agent 22 is held in the groove 14 formed in the engaging portion 6 of the frame 1. Besides, since the second engaging pawls 19 extend up to above the groove 14, the sealing agent 22 also enters the clearance between the second engaging pawls 19 and the inclined surface 13 to improve the sealability.

In the housing of the present invention, as described above, the engaging portion of the frame has a vertical plane formed as an inner surface of each side wall of the frame and also has a stepped portion which faces an opening brim side of the frame, the stepped portion comprising a horizontal plane approximately perpendicular to the vertical plane and an inclined surface contiguous to the horizontal plane and inclined to the bottom side of the frame as it approaches the vertical plane. The cover has a flat marginal portion and a plurality of first engaging pawls projecting from the marginal portion and inclined at a predetermined angle relative to the marginal portion. The marginal portion of the cover is brought into surface contact with the horizontal plane of the engaging portion, the first engaging pawls are brought into surface contact with the inclined surface of the engaging portion, and the tips of the first engaging pawls are allowed to bite into the vertical plane of the engaging portion and are thereby engaged with the same plane. Therefore, at the time of engagement of the cover with the frame, the angle between the first engaging pawls and the inclined surface becomes small, thus permitting the tips of the first engaging pawls to slide easily on the inclined surface without biting into the inclined surface, and hence the tips of the first engaging pawls can be allowed to bite into the vertical plane easily. Moreover, in the cover of the housing according to the present invention, since the first engaging pawls are inclined at a predetermined angle relative to the flat marginal portion, this angle is opened at the time of engaging the cover with the frame, so that the tips of the first engaging pawls can approach the vertical plane easily.

In the housing of the present invention, moreover, second engaging pawls projecting from the marginal portion of the cover are each formed between adjacent first engaging pawls and are extended above the inclined surface of the engaging portion, so that a sealing agent can be held between the second engaging pawls and the inclined surface and hence it is possible to improve the sealability of the housing.

Further, in the housing of the present invention, since the first engaging pawls are made narrower in width toward the tips thereof, it becomes easier for the tips to bite into the vertical plane of the engaging portion, thus making it possible to effect a complete engagement of the cover with the frame.

What is claimed is:

1. A housing comprising:

a frame having side walls and a bottom portion and further having an engaging portion along an opening brim of the frame;

a cover engaged with said engaging portion to close an opening of said frame, said engaging portion having a vertical plane formed as an inner surface of each said side wall of the frame and also having a stepped portion which faces an opening brim of the frame, said stepped portion including a horizontal plane which is approximately perpendicular to said vertical plane and an inclined plane which is contiguous to said horizontal plane and which is inclined toward said bottom portion as it approaches said vertical plane, said cover having a flat marginal portion and a plurality of first engaging pawls projecting from said marginal portion and inclined at a predetermined angle relative to said marginal portion, wherein each of the first engaging pawls comprises a tip, said marginal portion of said cover being brought into surface contact with said horizontal plane of said engaging portion, said first engaging pawls being brought into surface contact with said inclined plane of said engaging portion, and the tips of said first engaging pawls biting into said vertical plane of said engaging portion and thereby engaged with the vertical plane.

2. A housing according to claim 1, wherein said cover is further provided with second engaging pawls each formed between a pair of said first engaging pawls and projecting from said marginal portion, said second engaging pawls being extended above said inclined surface said engaging portion.

3. A housing according to claim 1, wherein the width of each of said first engaging pawls narrows toward the tips of said first engaging pawls.

* * * * *